(12) United States Patent
Wang et al.

(10) Patent No.: US 9,443,755 B2
(45) Date of Patent: Sep. 13, 2016

(54) METHOD OF FABRICATING MINIATURIZED SEMICONDUCTOR OR OTHER DEVICE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Donjiang Wang, Shanghai (CN); Steven Zhang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 279 days.

(21) Appl. No.: 13/660,853

(22) Filed: Oct. 25, 2012

(65) Prior Publication Data
US 2013/0109185 A1     May 2, 2013

(30) Foreign Application Priority Data
Oct. 28, 2011 (CN) .......................... 2011 1 0335055

(51) Int. Cl.
*H01L 21/311* (2006.01)
*H01L 21/768* (2006.01)
(Continued)

(52) U.S. Cl.
CPC ..... *H01L 21/76802* (2013.01); *H01L 21/0271* (2013.01); *H01L 21/0332* (2013.01);
(Continued)

(58) Field of Classification Search
CPC ................... H01L 21/31144; H01L 21/76805; H01L 21/76807
USPC ................... 438/637, 638, 700; 257/E21.242
See application file for complete search history.

(56) References Cited

U.S. PATENT DOCUMENTS 7,759,755 B2 * 7/2010 Adkisson et al. ............ 257/436
7,767,099 B2 * 8/2010 Li et al. ........................... 216/2
(Continued)

FOREIGN PATENT DOCUMENTS

| CN | 101165874 A | 4/2008 |
| CN | 101335190 A | 12/2008 |
| CN | 101611349 A | 12/2009 |

OTHER PUBLICATIONS

Macmilian Dictionary, http://www.macmillandictionary.com/us/dictionary/american/pattern_1.*
(Continued)

*Primary Examiner* — Julia Slutsker
(74) *Attorney, Agent, or Firm* — Innovation Counsel LLP

(57) ABSTRACT

A method of fabricating a miniaturized semiconductor or other such device takes advantage of a self-reorganization characteristic of an in-situ dissociable diblock copolymer to form a circular via hole that is centrally disposed relative to other device features. In one embodiment, the method is used to form a dual damascene structure. During formation of the dual damascene structure, due to the self-reorganization characteristics of the monomer constituents of the diblock copolymer, the position of the via hole can be ensured to be self aligned with the position of the trench, thus improving the performance and yield of the so formed semiconductor devices, and lowering fabrication costs.

20 Claims, 6 Drawing Sheets

(51) Int. Cl.
    *H01L 21/027*   (2006.01)
    *H01L 21/033*   (2006.01)
(52) U.S. Cl.
    CPC ..... *H01L21/0337* (2013.01); *H01L 21/31133* (2013.01); *H01L 21/31144* (2013.01); *H01L 21/76811* (2013.01)

(56) References Cited

U.S. PATENT DOCUMENTS

2007/0293041 A1* 12/2007 Yang et al. .................... 438/637
2008/0083991 A1*  4/2008 Yang et al. .................... 257/758
2008/0179667 A1   7/2008 Yang et al.
2008/0318005 A1* 12/2008 Millward ...................... 428/172
2009/0206489 A1*  8/2009 Li et al. ........................ 257/774

OTHER PUBLICATIONS

S. Matsumoto et al., "Highly Manufacturable ELK Integration Technology with Metal Hard Mask Process for High Performance 32nm-node Interconnect and Beyond", Panasonic Corporation, Semiconductor Company, Panasonic Semiconductor Engineering Co., Ltd., IEEE, 2010, 3 pages.

Sang-Kon Kim, "Process Simulation of Block Copolymer Lithography", Proceedings of 10th IEEE International Conference on Nanotechnology Joint Symposium with Nano Korea, Aug. 17-20, 2010, 4 pages.

Wai-kin Li et al., "Creation of sub-20-nm contact using diblock copolymer on a 300 mm wafer for complementary metal oxide semiconductor applications", J. Vac. Sci. Technol. B 25(6), Nov./Dec. 2007, 3 pages.

* cited by examiner

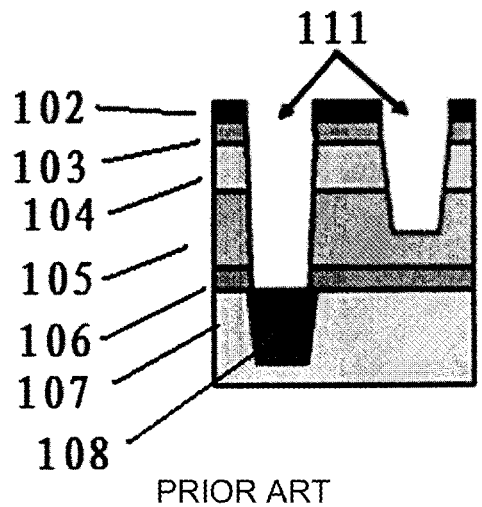
PRIOR ART
Fig.1E
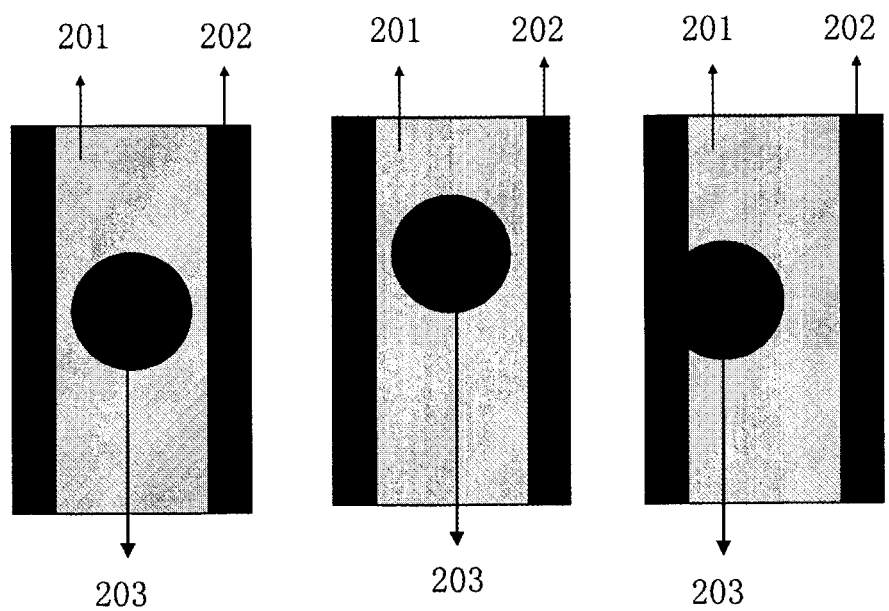
Fig.2A  Fig.2B  Fig.2C

METHOD OF FABRICATING
MINIATURIZED SEMICONDUCTOR OR
OTHER DEVICE

CROSS-REFERENCE TO RELATED APPLICATIONS

This application claims priority to Chinese Patent Application No. 201110335055.4, filed on Oct. 28, 2011 and entitled "Method of fabricating semiconductor devices", which is incorporated herein by reference in its entirety.

FIELD OF DISCLOSURE

The present disclosure of invention relates to the field of device miniaturization such as semiconductor miniaturization (e.g., scaling to smaller dimensions), particularly to a method of mass production fabricating of monolithically integrated semiconductor devices having very small features.

DESCRIPTION OF RELATED TECHNOLOGY

With the continual development of semiconductor techniques and over the years, the specified critical dimension(s) in semiconductor devices has shrunk to smaller and smaller values (e.g., deep submicron and smaller). With these ever shrinking values there arise several issues such as how to achieve circular via holes with ever smaller diameter sizes, how to precisely align the circular via holes with other features of the semiconductor device, such as for example with a trench in a dual damascene structure of the semiconductor device and so forth.

Referring to FIGS. 1A-1E and by way of background, a metal mask layer scheme has been widely adopted in current BEOL (back-end-off-line) fabrication of semiconductor devices. More specifically, FIGS. 1A-1E show a prior art procedure of forming a via hole (contact hole) and a trench (conductor pathway) in a semiconductor device of the prior art.

As shown in FIG. 1A, an exemplary and in-process semiconductor device comprises in bottom to top order: a Cu layer feature 108 to which contact or other communication is to be made, a first or base dielectric layer 107 (part of a substrate) in which the Cu layer 108 is embedded, a liner (barrier) layer 106 sealing in the Cu material, a second and extreme low-K dielectric layer 105 of extremely low dielectric constant (ELK), a third and low-K dielectric layer 104 of low dielectric constant (LK) that is larger than the ELK value, a silicon oxide layer 103, a metal hard mask layer 102 (not yet patterned) and a patterned photoresist (first PR) layer 101 formed on the metal hard mask layer 102. The patterned first PR layer 101 has openings that expose respective portions of the metal hard mask layer 102 that are next to be removed.

Then, as shown in FIG. 1B, the metal hard mask layer 102 is etched and its exposed portions are removed, whereafter the first PR layer 101 is also removed.

Then, as shown in FIG. 1C, a second photoresist (PR) 109 is coated on the structure of FIG. 1B, exposed to a pattern of a respective second mask (not shown) and developed to thereby expose a position on the semiconductor device where a via hole is to be formed.

Then, as shown in FIG. 1D, the semiconductor device is etched with a succession of one or more selective etch steps to form a via hole 110 communicating down to the area of the Cu layer feature 108. As can be seen from FIG. 1D, the exemplary via hole extends down from the top surface of the semiconductor device until where the liner layer 106 is exposed.

Then, as shown in FIG. 1E, the second PR 109, which had remained on the metal hard mask layer 102 until this time, is removed. This is followed by a further etching process using the metal hard mask layer 102 as a mask, so as to form one or more trenches 111 per the pattern of the metal hard mask layer 102. In the example of FIG. 1E, the trenches can be formed separately, or they (two in the illustrated example) can be formed with desired alignment with the via hole 110 to thus form a dual damascene structure.

However, in the semiconductor device fabricated through the above method (FIGS. 1A~1E), a shift in relative position often occurs between sidewalls of the trench 111 and the earlier and separately formed via hole 110 of the dual damascene structure, thus making repetition of prefect alignment very difficult if not impossible.

More specifically, and for example, in the top plan views of FIGS. 2A~2C it is shown how relative positions between the via hole (203) and the trench sidewalls (202) can shift from one mass production run (e.g., wafer batch) to the next.

FIG. 2A shows a first relative position relationship corresponding to the most ideal situation in which the via hole 203 is symmetrically aligned relative to the surrounding trench sidewalls 202. Reference label 202 also denotes the hard mask (for example, TiN) used to form the surrounding trench sidewalls while reference number 201 denotes slanted surface areas of the trench sidewalls.

FIG. 2B shows a situation in which the via hole 203 is shifted in the vertical direction and away from the ideal with respect to the trench 201. In this situation, although there is a shift between the trench 201 and the via hole 203, this error is acceptable because the via hole 203 is still located within the middle of the trench 201.

FIG. 2C shows a situation in which the via hole 203 is shifted in the horizontal direction and away from the ideal with respect to the trench 201. As shown in FIG. 2C, due to the limited width of the trench 201, this horizontal shift tends to cause a portion of the via hole 203 entering into the region of the hard mask 202, which is unacceptable in semiconductor device fabrication because the cross sectional area of the via hole 203 is reduced; perhaps below a specified minimum, and thus this outcome is to be avoided.

A method of forming a trench by means of self-reorganization has been proposed by S. Kim (see, "Process Simulation of Block Copolymer Lithography", Proceedings of 10th IEEE International Conference on Nanotechnology Joint Symposium with Nano Korea 2010) incorporates herein by reference. In this method, the self-reorganization is directed by graphoepitaxy or by using a chemical surface pattern. By means of annealing, polymers comprised of polystyrene (PS) monomers and poly(methyl methacrylate) (PMMA) monomers, also known as (a.k.a.) polystyrene-block-poly(methyl methacrylate) copolymers (PS-b-PMMA) are broken down into their monomer constituents, and thus, separated PS and PMMA monomer strips of rectangular form are formed on a substrate. These two kinds of monomer strips are immiscible relative to one another and thus separated from each other. Next, in the S. Kim process, the PMMA strip is selectively removed with acetic acid under the irradiation of ultra-violet light, and thereby a trench is formed on the substrate.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention allows for formation of an essentially circular via of desired cross-sectional area disposed substantially symmetrically relative to surrounding other features such as trench sidewalls.

According to a first aspect of the present disclosure of invention, there is provided a method of fabricating a semiconductor (or other alike) device, comprising the following steps: forming a substantially symmetrical and enclosed frame volume above and on a substrate surface of a semiconductor or alike device; filling the formed frame volume with a diblock copolymer (an example of a dissociable copolymer) composed of a first monomer that is chemically joined (bound to) a second monomer; inducing breakdown (disassociation) of the diblock copolymer into its otherwise immiscible monomer constituents where this is followed by self-reorganization of the constituent monomers of the diblock copolymer to thereby form an essentially circular globule of the first monomer disposed at a central position within the symmetrically enclosing frame and surrounded by the second monomer. Then the process is continued by solidifying the second monomer (M2), and selectively removing the circular globule of first monomer material (M1) to thus leave behind a centrally located and essentially circular void (hole) in its place. Thereafter the process is continued by selectively etching the semiconductor or other device while using the left behind and solidified second monomer as a mask to thus form a via hole whose shape and position align with the centrally located and essentially circular void (hole) that the first monomer earlier occupied.

In accordance with an aspect of the disclosure, the method further comprises removing the second monomer after forming the via hole.

In accordance with an aspect of the disclosure, the enclosing frame defines a rectangular (e.g., square) interior volume of the frame.

In accordance with an aspect of the disclosure, the rectangular frame interior comprises of opposed first and second sidewalls made of a respective first material and opposed third and fourth sidewalls made of a respective and different second material. The method may include, after removing the second monomer, etching the semiconductor device while using a hard mask one of the first and second mask materials as a mask to form a dual damascene structure.

In accordance with an aspect of the disclosure, the method further comprises: after forming the dual damascene structure, removing what is left of the rectangular frame.

In accordance with an aspect of the disclosure, the step of forming the first and second sidewalls of the rectangular frame with a hard mask material comprises: forming a hard mask layer by depositing the hard mask material on the substrate of the semiconductor device; and selectively etching the deposited hard mask material.

In accordance with an aspect of the disclosure, the method further comprises: forming the third and fourth sidewalls of the rectangular frame out of a photoresist material.

In accordance with an aspect of the disclosure, the step of forming the third and fourth sidewalls of the rectangular frame with photoresist comprises: forming a photoresist layer on the semiconductor device; and implementing exposure and development of the photoresist layer.

In accordance with an aspect of the disclosure, the step of forming the third and fourth sidewalls of the rectangular frame with photoresist comprises: forming a bottom anti-reflection coating on the semiconductor device; and implementing selective etching to the bottom anti-reflection coating layer.

In accordance with an aspect of the disclosure, the diameter of the circular pattern of the first monomer is controlled through adjusting the mass ratio of the first and second monomers in the diblock copolymer.

In accordance with an aspect of the disclosure, the diameter of the circular pattern of the first monomer is larger than or equal to the diameter of the via hole to be formed.

In accordance with an aspect of the disclosure, the diameter of the via hole is further controlled in the step of etching the semiconductor device using the second monomer as a mask.

In accordance with an aspect of the disclosure, the mass ratio of the first and second monomers of the diblock copolymer is in the range of 10%~50%.

In accordance with an aspect of the disclosure, the diblock copolymer is a polystyrene-block-poly(methyl methacrylate) copolymer, wherein the first monomer is poly(methyl methacrylate) and the second monomer is polystyrene.

In accordance with an aspect of the disclosure the self-reorganization process is a solvent fumigation or annealing process.

In accordance with an aspect of the disclosure, the etching is dry etching, in which the gases used comprise: Ar, O2, C4F8, CH2F2, CF4 or CHF3.

In accordance with an aspect of the disclosure, a via hole can be formed in a semiconductor or other device through the self-reorganization of the immiscible monomer constituents of the in-situ disassociated diblock copolymer.

Further features and aspects of the present disclosure of invention and advantages thereof will become apparent from the following detailed description of exemplary embodiments and with reference to the accompanying drawings.

BRIEF DESCRIPTION OF THE DRAWINGS

With reference to the accompanying drawings, the present disclosure of invention can be more clearly understood based on the following detailed description, in which:

FIGS. 1A~1E are schematic diagrams showing a procedure of forming a via hole and a trench on a semiconductor device in a prior art process.

FIGS. 2A~2C are schematic diagrams showing the relative position relationship of a via hole and a trench during a prior art process of semiconductor device fabrication.

DETAILED DESCRIPTION

Figure 1A:
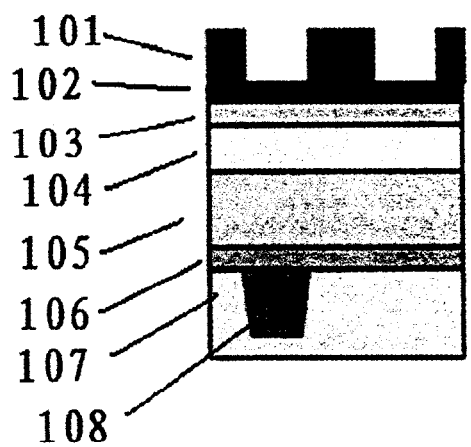
Figure 1B:
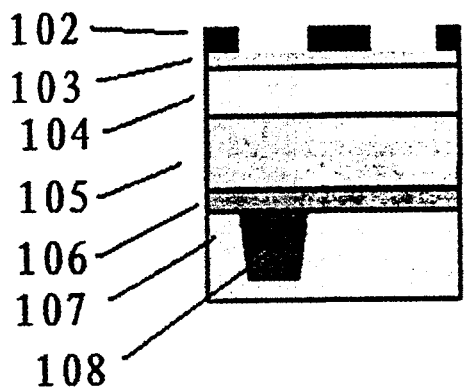
Figure 1C:
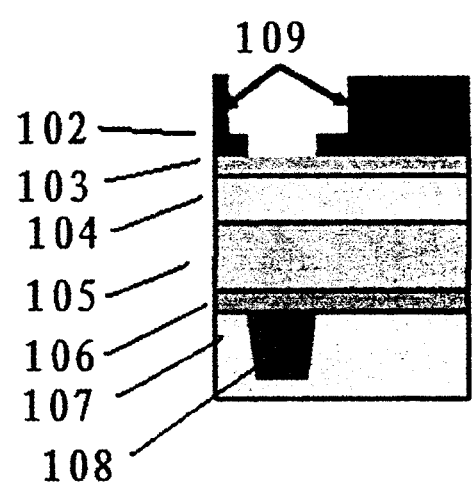
Figure 1D:
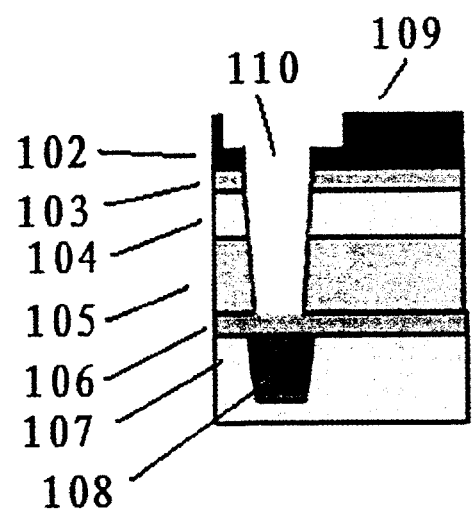

Various exemplary embodiments in accordance with of the present disclosure of invention will now be described in detail with reference to the drawings. It should be noted that the relative arrangement of the components and steps, the numerical expressions, and numerical values set forth in these embodiments do not limit the scope of the present teachings unless it is specifically stated otherwise.

Meanwhile, it should be appreciated that those parts in the drawings are not shown to practical scale or full detail and may be simplified for the sake of easier description.

The following description of at least one exemplary embodiment is merely illustrative in nature and is in no way intended to limit the present disclosure of invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below a method of fabricating semiconductor devices according to one embodiment of the present disclosure of invention will be described in detail in conjunction with the flow chart of FIG. 3 and the cross sectional views of FIGS. 4B~4F plus the exemplary top plan view of FIG. 4A.

Figure 3:
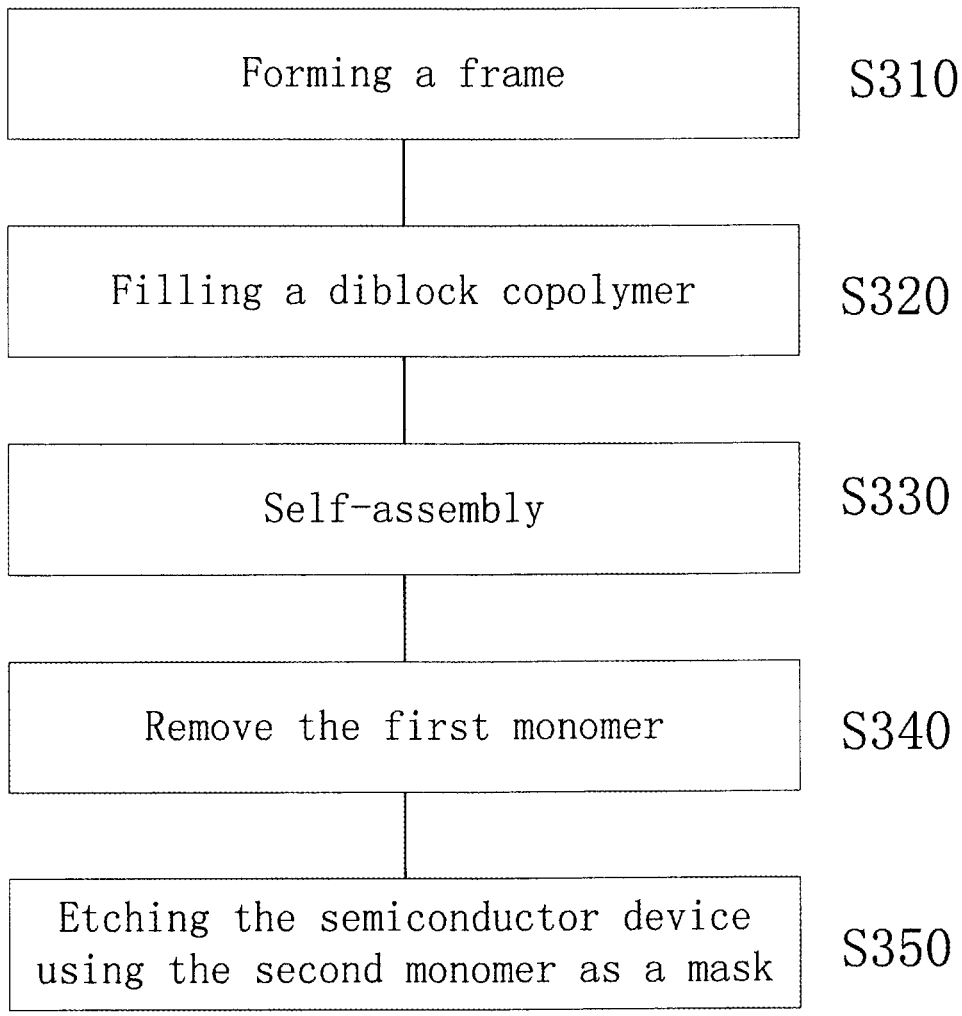
FIG. 3 is a flowchart of a method of fabricating semiconductor devices according to one embodiment of the present disclosure.

FIG. 3 briefly shows a basic flowchart of a method of fabricating a self-centered and self-shaped via in a semiconductor device according to one embodiment of the present disclosure.

As shown in FIG. 3, the method of fabricating the semiconductor device may comprise the following steps (S310)-(S350):

(a) forming a substantially symmetrical (at least in its interior receiving space) and fluid-enclosing frame (a fluid containerizing frame) on a surface of a semiconductor device substrate (S310);

(b) filling the frame at least partially with a fluidic diblock copolymer composed of and at a substantially homogenous ratio there between of a first monomer chemically joined with a second monomer (S320);

(c) decomposing the diblock copolymer in-situ into its constituent monomers, where the constituent monomers are immiscible relative to one another and thus precipitate apart from one another, this implementing self-reorganization of the separated constituent monomers of the diblock copolymer so as to form a substantially circular globule composed essentially of the first monomer and disposed at a substantially central portion of the substantially symmetrical and enclosing frame interior, wherein the first monomer is surrounded by the precipitated apart therefrom, second monomer (S330);

(d) solidifying the second monomer (M2) and selectively removing the first monomer (M1) (S340) so as to leave behind a substantially circular and substantially centrally disposed void (hole) in its place; and (e) using the left behind and solidified second monomer as a mask for selectively etching the semiconductor device substrate so as to thereby form a via hole that is aligned to the substantially circular and substantially centrally disposed void (hole) that was occupied by the removed first monomer (S350).

Figure 4A:
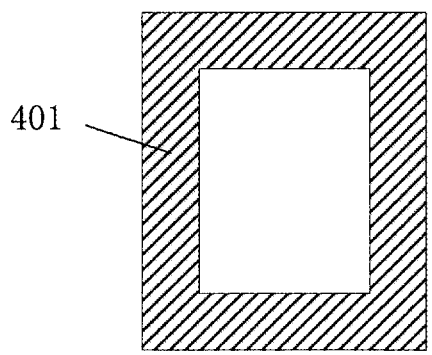
FIGS. 4A~4F are schematic diagrams of a semiconductor device fabrication procedure according to one embodiment of the present disclosure of invention.

In the example shown in FIG. 4A, the substantially symmetrical and enclosed frame (401) is a rectangular frame. The present disclosure of invention will be described below taking the rectangular frame as an example. However, those skilled in the art may appreciate from the foregoing that symmetrical surface energy effects of the enclosing frame are used to cause the first monomer to precipitate symmetrically into the central region of the symmetrical frame interior and the top plan view of the frame (401) is not limited to the rectangular shape, and can be in polygonal, circular, elliptical or any other symmetrical shape as deemed convenient for a given specific application. In one embodiment, a first formed via hole serves as a frame for a next formed and yet smaller in diameter, second via hole.

Figure 4B:
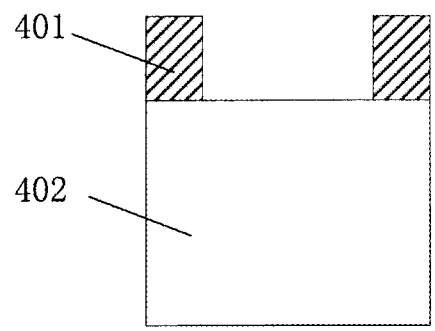

FIGS. 4A~4F are schematic diagrams showing a method of fabricating semiconductor devices according to a corresponding first embodiment. FIG. 4A is a top plan view of a rectangularly shaped symmetrical frame 401. FIG. 4B is a cross sectional view showing the semiconductor device 402 and the rectangular frame 401 formed thereon.

As shown in FIGS. 4A and 4B, first, a rectangular frame 401 is formed on a surface of a semiconductor device (S310). Those skilled in the art may appreciate that, although only one rectangular frame 401 is shown in FIGS. 4A and 4B as an example, in practice, large numbers of corresponding rectangular frames like 401 can be formed, on the surface of the semiconductor device 402, with each being positioned centrally about a location where a corresponding circular via hole is to be formed. Herein, any suitable material can be selected as the material of the rectangular frame 401, for example, an approximate photoresist material, an appropriate hard mask material (such as Ti or TiN), a bottom anti-reflection coating (BARC) material, and the like. Depending upon the specific one or more frame materials selected for forming it, the frame can be formed in various suitable manners. For example, if photoresist (PR) is selected as the material of the frame, the rectangular frame can be formed through a series of processes that are well known in the art, such as spin coating, exposure with a photomask having the rectangular pattern, and development. If a hard mask is selected as the material of the frame, it can be formed through sputtering etc, and then it is shaped into a rectangular frame through photolithography and selective etching. The basics of the above processes are well known by those skilled in the art, and will not be detailed herein.

Figure 4C:
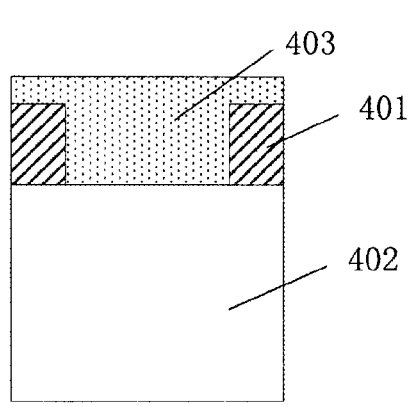

Then, as shown in FIG. 4C, a fluidic diblock copolymer 403 is at least partially filled into the rectangular frame (S320). In the example of FIG. 4C, the fluidic diblock copolymer 403 is uniformly coated over and more than amply fills the symmetrical frame 401. The diblock copolymer 403 is generally composed of two monomers that are chemically joined to one another, but can be chemically separated from one another. That is, the diblock copolymer 403 is composed of a first monomer (M1) and a second monomer (M2) where, when these are chemically separated from one another, they are immiscible with respect to one another and precipitate apart from one another. For example, the diblock copolymer 403 may be polystyrene-block-poly (methyl methacrylate) copolymer (PS-b-PMMA for short hereinafter), which comprises two monomers, that is for example a PS monomer (as the first monomer) and a PMMA monomer (as the second monomer). The diblock copolymer 403 can be filled into a respective one or more frames (only one shown) through, for example, a spin coating process.

Figure 4D:
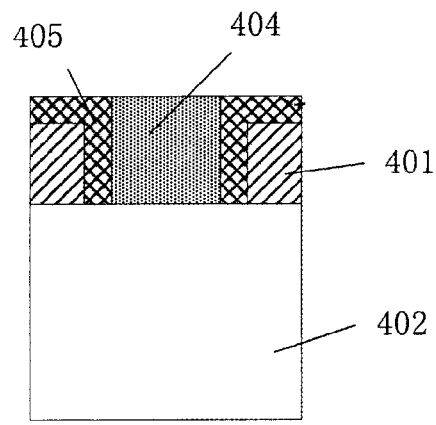

Then, as shown in FIG. 4D, a self-reorganization process is carried out wherein the diblock copolymer 403 is disassociated into its constituent and separate first monomer 404 and second monomer 405 where upon disassociation, the respective monomers precipitate apart from one another and coalesce with their own kind in a symmetrical manner due to symmetry of boundary conditions (S330).

The diblock copolymer 403 has the following characteristics: (a) The first monomer 404 and the second monomer 405 of the diblock copolymer 403 can be chemically separated to form self-coalescing globules (ones having self-affinity) of the respective monomers, where through such self-reorganization, a more dense and/or a more surface-phillic one of the first and second monomers coats the inner sidewalls of the frame to which it optionally has coating affinity; and a less dense and/or a more surface-phobic other of the separated monomers coalesces into a centrally located circular globule that is symmetrically spaced apart from the inner sidewalls of the symmetrically shaped frame to which it optionally may have a phobia. The step of decomposing the diblock copolymer 403 into its constituent first and second monomers may include a process such as solvent fumigation followed by monomer annealing. More specifically, and taking PS-b-PMMA as an example again, when implementing self-reorganization step for the PS-b-PMMA diblock copolymer (e.g., by way of solvent fumigation and annealing) then, depending on the mass ratio of the PS monomer and of the PMMA monomer, in one embodiment, a circular PS monomer pattern will be centrally formed to be surrounded by a PMMA monomer background, or alternatively; a circular PMMA monomer pattern will be centrally formed to be surrounded by a PS monomer background.

Yet more specifically, and for example, when the mass per unit volume (density) of PS monomer is larger than the mass per unit volume (density) of PMMA monomer, it is tended for the less dense PMMA monomer to form the circular and centrally located monomer pattern, in which case, the first monomer is PMMA monomer and the second monomer is PS monomer.

On the other hand, if the mass (per unit volume) of PMMA monomer is larger than the mass (per unit volume) of PS monomer, it is tended to form a central PS monomer pattern, in which case, the first monomer is PS monomer and the second monomer is PMMA monomer.

PMMA is taken as the first (and centrally self-disposing) monomer in the present embodiment, for example. Both the shape and the position of the first monomer pattern which is formed through the self-reorganization process are influenced by the symmetry of the boundary conditions. In the present embodiment, as shown in FIG. 4D, because of the presence of the symmetrical and fluid enclosing rectangular (e.g., square) frame 401, the PMMA monomer (the first monomer 404) pattern is rendered as a circle located at the centre area of the rectangular frame 401, and the PS monomer (the second monomer 405) surrounds the circular PMMA monomer. It is to be understood that the annealing process hardens (cures, re-polymerizes) at least the second monomer whereby the originally liquid form second monomer (M2) is solidified into a stable (fixed) shape surrounding the circular shape of the centrally located first monomer (M1).

The diameter of the circular pattern of the first monomer can be controlled through controlling a homogenous mass ratio of the first monomer relative to the second monomer of the diblock copolymer. For example, the mass ratio of the first monomer relative to the second monomer can be adjusted to be between 10% and 50%. Specifically, in the PS-b-PMMA embodiment, the mass ratio of the PS and PMMA monomers can be adjusted depending on the specified diameter of the via hole that is to be formed, such that the diameter of the circular pattern of PS monomer (or PMMA monomer) finally formed is substantially equal to the pre-specified diameter of the via hole to be formed, or alternatively; such that the diameter of the circular pattern of PS monomer can be larger than the pre-specified diameter of the to be formed via hole, and then in a subsequent etching process, the diameter of the via hole to be formed is further controlled through adjustable parameters of the etching process.

By controlling the mass ratio of the first monomer relative to the second monomer when both are homogenously distributed constituents of the diblock copolymer, one can control the mass amount of the first monomer (M1) that precipitates out to become the circularly shaped globule of self-phillic matter at the center of the symmetrical shape of the frame and one can simultaneously control the mass amount of the second monomer (M2) that precipitates out to become the surrounding background material that surrounds the circular globule whereby the diameter of the circular globule can be consistently and reliably made very small in a mass production environment, thereby satisfying a corresponding and pre-specified requirement in a semiconductor device design for a small-sized via hole that is accurately positioned relative to other features (e.g., trench sidewalls) of an in-process semiconductor device.

Figure 4E:
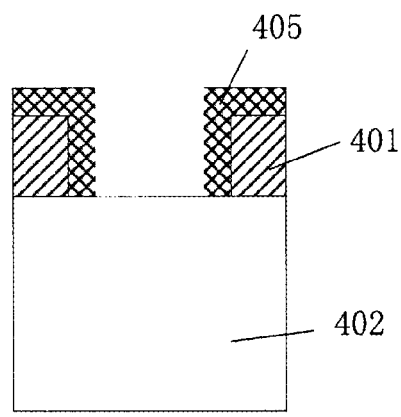

Next, as indicated in FIG. 4E, the first monomer (M1) is selectively removed while the second monomer (M2) is left in place and solidified so as to preserve the shape and size of the hole that the removed first monomer (M1) previously occupied (S340).

For the case in which the PMMA monomer serves as the selectively removed first monomer (M1), the PMMA monomer can be selectively removed with acetic acid and while under irradiation by ultraviolet (UV) light. The UV light hardens the second monomer (M2) while simultaneously allowing the PMMA to become dissolved in thus washed away with irrigation with acetic acid and/or another appropriate solvent.

Figure 4F:
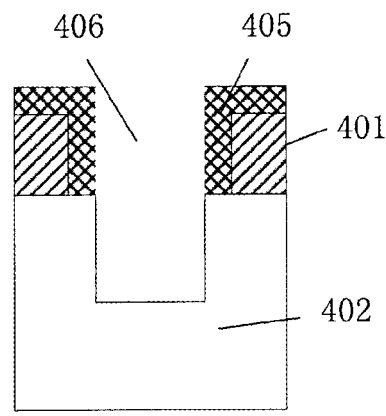

Next, as shown in FIG. 4F, the hardened (fixed) second monomer (M2) 405 is used as an etch mask and the semiconductor device 402 is selectively etched while using the second monomer 405 as a mask to thereby form a via hole 406 having a placement and shape corresponding to the accurate placement and shape of the void left behind by the selectively removed first monomer (M1) (S350). Here, in FIG. 4F, the utilized etching process can be a dry etching or a wet etching process (preferably a wet etching one), and the gases used in the dry etching embodiment may comprise for example Ar, O2, C4F8, CH2F2, CF4 and/or CHF3.

While one embodiment according to the present disclosure of invention has been described above in detail in conjunction with FIG. 3 and FIGS. 4A–4F, the present teachings are not limited thereto. For example, based on specific requirements of a respective application, the second monomer (M2) can be selectively removed after the via hole 406 is formed. Further, the rectangular frame also can be removed after removing the second monomer. Thus a next step after that of FIG. 4F may appear as just substrate 402 with only via 406 extending into that substrate, whereafter additional processing (e.g., filling the via 406 with a conductive material) is carried out on the in-process structure as set forth by the specific requirements of the respective application.

By way of further explication, in one embodiment according to the present teachings, the formation of the via (e.g., 406) as continued to be embraced by two or more sidewalls of the frame can lead to formation of a dual damascene structure.

Figure 5A:
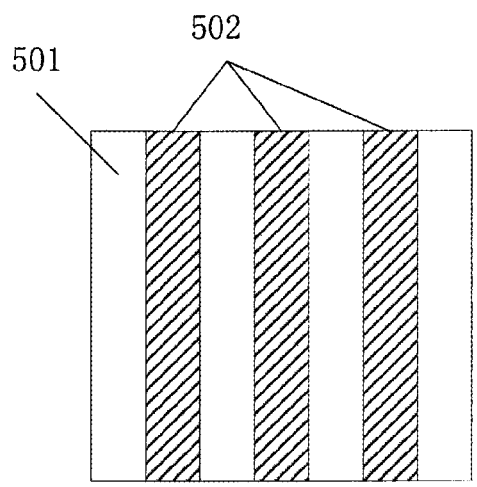
FIGS. 5A~5D are schematic diagrams of a semiconductor device fabrication procedure according to another embodiment.

More specifically, and as shown starting with FIG. 5A (top plan view), first, multiple strips of a hard mask 502 are formed on a semiconductor device substrate 501 extending longitudinally in the vertical direction of the drawing. The spaced apart dimension between these first strips 502 of hard mask material corresponds to the pre-specified upper width of a to be-formed, dual damascene structure. The patterned hard mask strips 502 can be formed through various manners. For example, a layer of hard mask can be blanket deposited on the semiconductor device substrate 501, and then the strips-including pattern of the hard mask 502 is formed through photolithography.

Figure 5B:
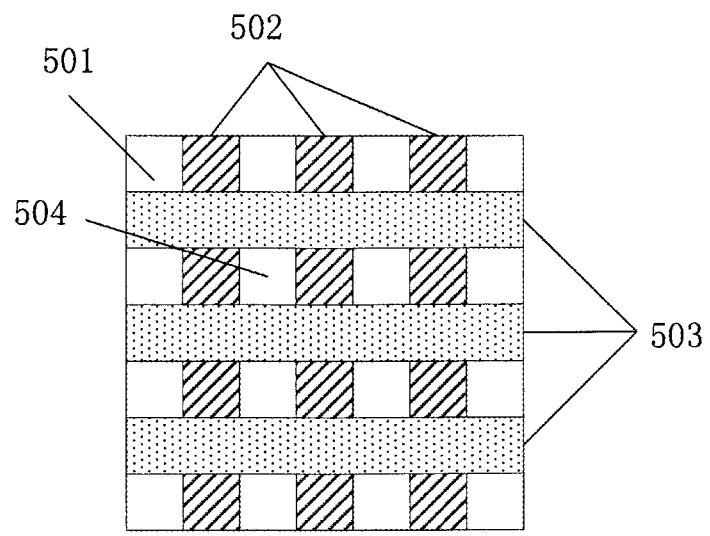
Figure 5C:
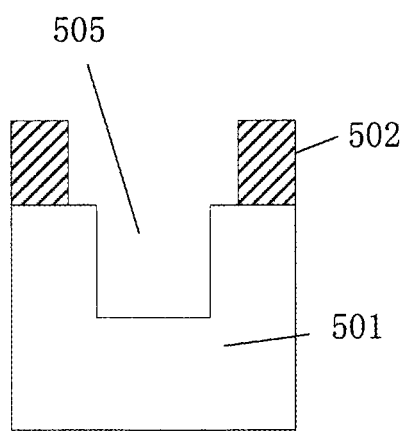

Then, as schematically shown in the top plan view of FIG. 5B, a different material, for example a photoresist layer is blanket deposited on the semiconductor device substrate 501 having the patterned strips 502, and then this different second material (e.g., PR) is exposed with use of an appropriate photomask having a respective second pattern of orthogonal strips and it is developed to thereby form the illustrated multiple strips of photoresist 503 extending in the horizontal direction. Thereby, a plurality of rectangularly enclosed areas 504 (and example of symmetrically framed volumes into which copolymer may be added) are formed on the semiconductor device substrate 501. The center points of the rectangular areas 504 substantially correspond to the center points of the to be formed via holes 505 (FIG. 5C). It is to be understood that in this illustrative embodiment, the copolymer-containerizing rectangular frame of each rectangular area 504 is formed by the hard mask 502 serving to define a first set of opposed interior sidewalls of the frame and the photoresist 503 serving to define a second set of opposed interior sidewalls of the frame.

Then, then the via holes 505 are formed in their respective rectangular areas 504. This step is similar to the method described above with reference to FIG. 3 and FIGS. 4A–4F, which will not be repeated here. The semiconductor device after forming the via holes is shown in FIG. 5C, wherein the photoresist 503 and the second monomer on the hard mask have been removed. If desired at this stage and in accordance with one embodiment, a conductive material is deposited into the dual damascene structure defined by the first via holes and the opposed sidewalls of the left-behind frame strips 502.

Figure 5D:
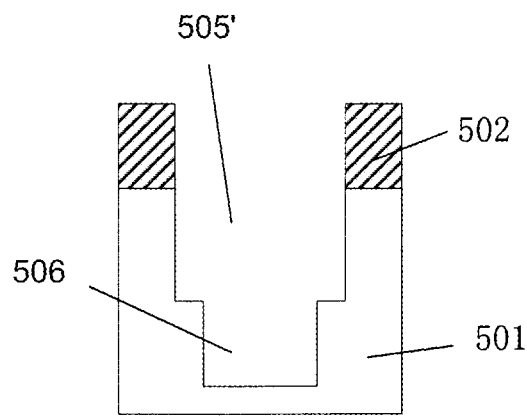

Alternatively and as shown in FIG. 5D, the process can be repeated where this time the first formed via 505 serves as a symmetrical frame (this time a circular frame) and new copolymer is deposited thereinto, disassociated into its constituent monomers (M1' and M2', not shown) and the semiconductor device 501 is further etched to form the even smaller vias 506 below the earlier formed first vias 505. Thereafter, an appropriate conductive material (e.g., interconnect copper) can be deposited into the voids defined between the opposed walls of the upper hard mask 502 and the further voids defined below them. In one embodiment, after the second and smaller vias 506 are formed, the upper hard mask 502 is used to cut a vertically extending trench 505' through the substrate material in which the first vias (505 of FIG. 5C) were formed.

Figure 6A:
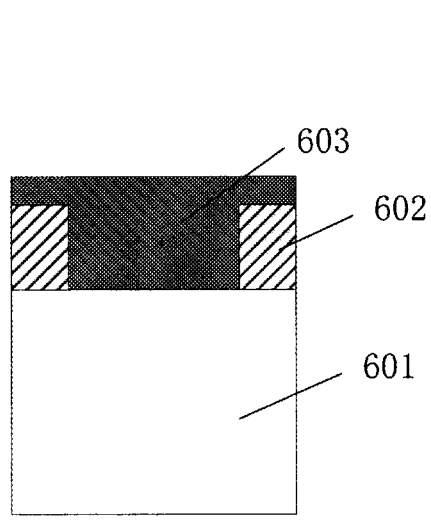
FIGS. 6A~6C are schematic diagrams of a semiconductor device fabrication procedure according to yet another embodiment.
Figure 6B:
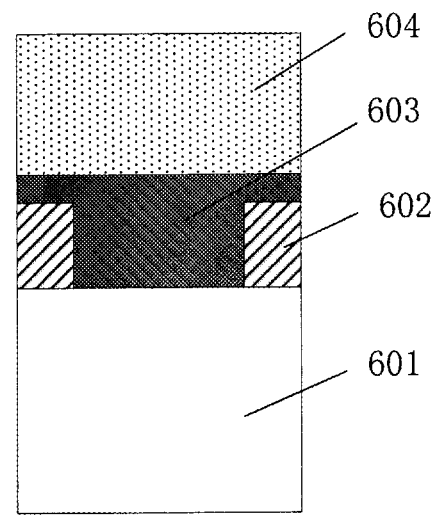
Figure 6C:
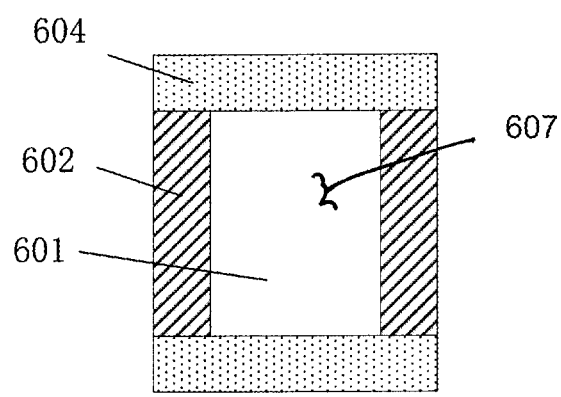

Referring next to FIGS. 6A–6C, in order to improve the process of PR exposure and development by reducing unwanted reflections of the photolithography radiation, In accordance with an aspect of the disclosure, a Bottom Anti-Reflection Coating (BARC) 603 is formed on the substrate 601 before forming a patterned photoresist pattern. This is shown in FIG. 6A, wherein reference number 601 denotes a semiconductor device substrate, 602 denotes a patterned hard mask. Then, as shown in FIG. 6B, a photoresist pattern 604 is formed and developed on top of the BARC where the developed PR pattern 604 exposes rectangular (or other symmetrically shaped) regions of the BARC 603. Then, by using the photoresist pattern 604 as a mask, the exposed BARC 603 is etched through, for example by dry etching, to thereby remove the BARC that is not covered by the photoresist 604. As a consequence, a symmetrically shaped frame (having recess 607 for receiving copolymer) is formed as shown in FIG. 6C. In this embodiment, two opposed sidewalls of the rectangular frame are formed by photoresist and BARC together while another two opposed sidewalls of the rectangular frame are formed by the strips of hard mask 602. Of course, based on specific fabrication process requirements, the photoresist 604 can be further selectively removed, so that the first mentioned ones of the opposed interior sidewalls of the rectangular frame are formed by the BARC alone. Thereafter, an appropriate di-block (or tri-block if desired) copolymer is filled at least partially into the interior of the symmetrical frame and the process of creating a circular void centered therein is begun.

With the dual damascene or other appropriate structures formed in accordance with the manners described above, due to the self-reorganization characteristic of the disassociated diblock copolymer, the self-centering position of the via hole can be ensured in mass production conditions to be properly aligned with respect to the interior sidewalls of the frame (where part of the frame also defines the position of the trench), thus improving the performance and yield of semiconductor devices, and lowering fabrication costs.

Thus, the method of fabricating semiconductor devices according to the present disclosure of invention has been described in detail. In order to not obscure the concept of the teachings, some details including those known in the art are not described herein. More specifically, in FIG. 4D when the circular and centrally located globule 404 of the first monomer (M1) coalesces onto itself, it might not extend all the way down to contact the upper major surface of the substrate 402 and instead it may be bottomed under by some of the denser material of the second monomer (M2). However, those of ordinary skill in the art will know how to implement technical solutions (e.g., partial etch backs) based on the more basic concepts disclosed herein.

Although some specific embodiments in accordance with the present disclosure of invention have been demonstrated in detail with schematic examples, it should be understood by a person skilled in the art that the above examples are only intended to be illustrative but not limiting to the scope of the present disclosure of invention. It should be understood by a person skilled in the art that the above embodiments can be modified without departing from the scope and spirit of the present teachings.

What is claimed is:

1. A method of fabricating a semiconductor device, the method comprising:
   forming a frame on a surface of a substrate, wherein an interior is surrounded by one or more interior sidewalls of the frame;
   providing a copolymer member comprising a first monomer and a second monomer;
   after the providing, processing the copolymer such that the first monomer is disposed at a center region of the interior and is surrounded by the second monomer, wherein a planar top surface of the second monomer directly abuts a top surface of the first monomer, is coplanar with the top surface of the first monomer, and covers the frame in a direction perpendicular to the planar top surface of the second monomer;

after the processing, solidifying the second monomer to produce a solidified monomer member;

after the solidifying, selectively removing the first monomer to produce a void; and using the void and the solidified monomer member for partially removing the substrate.

2. The method according to claim 1, comprising:
etching the substrate using the solidified monomer as a mask to form a first via hole.

3. The method according to claim 1, further comprising:
removing the solidified second monomer after the substrate has been partially removed.

4. The method according to claim 1, wherein the interior is at least one of a symmetrical non-circular interior and a rectangularly shaped interior.

5. The method according to claim 1, wherein the one or more interior sidewalls comprise opposite first and second sidewalls and opposite third and fourth sidewalls, and wherein the method comprises:
forming the first and second sidewalls with a first mask material;
forming the third and fourth sidewalls with a second mask material different from the first mask material, wherein the third and fourth sidewalls directly contacting the first and second sidewalls; and
after selectively removing the first monomer, selectively removing the third and fourth sidewalls.

6. The method according to claim 5, comprising:
after the third and fourth sidewalls have been removed, etching the substrate using the first and second sidewalls as a mask to form a dual damascene structure.

7. The method according to claim 6, further comprising:
after forming the dual damascene structure, removing the first and second sidewalls.

8. The method according to claim 5, comprising:
forming a blanket of the first mask material on the substrate; and
selective etching the blanket of the first mask material to form the first and second sidewalls.

9. The method according to claim 5, wherein the second mask material is a photoresist.

10. The method according to claim 9, comprising:
forming a photoresist layer on the substrate; and
exposing and developing the photoresist layer to form the third and fourth sidewalls.

11. The method according to claim 10, wherein forming the opposed third and fourth sidewalls with the second mask material further comprises:
forming an anti-reflection coating layer on a bottom surface of the substrate; and
selective etching away part of the anti-reflection coating layer.

12. The method according to claim 1, wherein a diameter of the first monomer is controlled through adjusting a mass ratio of the first monomer relative to the second monomer in the copolymer member.

13. The method according to claim 12, wherein the diameter of the first monomer is larger than or equal to a diameter of the first via hole that is to be formed.

14. The method according to claim 13, wherein the diameter of the first via hole is controlled during the partially removing.

15. The method according to claim 10, wherein the mass ratio of the first monomer to the second monomer is in a range from about 10% to about 50%.

16. The method according to claim 1, wherein the first monomer is polystyrene, and wherein the second monomer is poly (methyl methacrylate).

17. The method according to claim 16, processing includes a solvent fumigation step and an annealing process.

18. A method for fabricating a semiconductor device, the method comprising:
forming a set of walls on a substrate, wherein the set of walls comprises a first wall and a second wall, wherein the first wall is formed of a first material, and wherein the second wall directly contacts the first wall, is formed of a second material that is different from the first material, and is oriented at an angle with respect to the first wall in a plan view of the set of walls;
providing a copolymer member such that a portion of the copolymer member is surrounded by the set of walls, wherein the copolymer member comprises a first monomer and a second monomer;
after the providing, processing the copolymer member such that the first monomer is surrounded by the second monomer;
after the processing, solidifying the second monomer to produce a solidified monomer;
after the solidifying, selectively removing the first monomer; and
after the selectively removing, using the solidified monomer in partially removing the substrate.

19. The method of claim 18, wherein the first wall is positioned between the substrate and a material portion after the set of walls has been formed, wherein the material portion is formed of the second material, and wherein the method comprises removing the material portion after the first monomer has been selectively removed.

20. A method of fabricating a semiconductor device, the method comprising:
forming a frame on a substrate;
processing a copolymer member to form a first-monomer member and a second-monomer member, wherein the first-monomer member is surrounded by the frame, wherein a planar top surface of the second-monomer member covers the frame in a direction perpendicular to the planar top surface of the second-monomer member, and wherein a top surface of the first-monomer member is coplanar with the planar top surface of the second-monomer member;
after the processing, solidifying the second-monomer to produce a solidified monomer member;
after the solidifying, selectively removing the first-monomer member to produce a void; and
using the void and the solidified monomer member for partially removing the substrate.

* * * * *